United States Patent
Jo

(10) Patent No.: US 9,728,152 B2
(45) Date of Patent: Aug. 8, 2017

(54) SHIFT REGISTER WITH MULTIPLE DISCHARGE VOLTAGES

(71) Applicant: LG Display Co., Ltd., Seoul (KR)

(72) Inventor: Sung-Hak Jo, Paju-si (KR)

(73) Assignee: LG Display Co., Ltd., Seoul (KR)

(*) Notice: Subject to any disclaimer, the term of this patent is extended or adjusted under 35 U.S.C. 154(b) by 117 days.

(21) Appl. No.: 14/315,902

(22) Filed: Jun. 26, 2014

(65) Prior Publication Data
US 2015/0002504 A1 Jan. 1, 2015

(30) Foreign Application Priority Data

Jun. 27, 2013 (KR) ........................ 10-2013-0074206

(51) Int. Cl.
G09G 3/36 (2006.01)
G11C 19/28 (2006.01)

(52) U.S. Cl.
CPC .......... *G09G 3/3677* (2013.01); *G11C 19/28* (2013.01); *G09G 2310/0286* (2013.01); *G09G 2310/08* (2013.01); *G09G 2320/0209* (2013.01); *G09G 2320/0223* (2013.01)

(58) Field of Classification Search
CPC ......... G09G 3/3677; G09G 2310/0286; G09G 2310/08; G09G 2320/0209; G09G 2320/0223; G11C 19/28; G11C 19/289; G11C 19/38; G11C 27/04
USPC ........................................................ 345/213
See application file for complete search history.

(56) References Cited

U.S. PATENT DOCUMENTS

| 2003/0227433 | A1 | 12/2003 | Moon | |
|---|---|---|---|---|
| 2007/0296662 | A1* | 12/2007 | Lee | G09G 3/3677 345/87 |
| 2010/0214279 | A1* | 8/2010 | Kim | G09G 3/344 345/213 |

(Continued)

FOREIGN PATENT DOCUMENTS

CN 1835063 A 9/2006
CN 101752004 A 6/2010

(Continued)

OTHER PUBLICATIONS

Office Action for Chinese Patent Application No. CN 201410295402.9, Jan. 25, 2016, 13 Pages.

(Continued)

*Primary Examiner* — Lisa Landis
(74) *Attorney, Agent, or Firm* — Fenwick & West LLP

(57) ABSTRACT

A shift register for reducing size of a display apparatus through a reduction in falling edge time of a scan pulse. The shift register includes stages for sequentially outputting carry pulses and scan pulses. Each stage includes a carry output unit for generating a carry pulse, based on a first discharge voltage and a clock pulse having a low-level voltage with a level substantially equal to the first discharge voltage, and supplying the carry pulse to at least one of an upstream stage and a downstream stage, a scan output unit for generating a scan pulse, based on a second discharge voltage having a higher voltage value than the first discharge voltage and the clock pulse, and supplying the scan pulse to a corresponding gate line, and a node controller for controlling voltages at nodes connected to the carry output unit and the scan output unit.

13 Claims, 6 Drawing Sheets

(56) References Cited

U.S. PATENT DOCUMENTS

| | | | |
|---|---|---|---|
| 2011/0273417 A1* | 11/2011 | Shin | G09G 3/20 |
| | | | 345/211 |
| 2012/0269316 A1* | 10/2012 | Jang | G09G 3/3677 |
| | | | 377/75 |
| 2014/0105351 A1* | 4/2014 | Chan | G11C 19/184 |
| | | | 377/64 |

FOREIGN PATENT DOCUMENTS

| | | |
|---|---|---|
| CN | 101752005 A | 6/2010 |
| KR | 10-2009-0050358 | 5/2009 |
| KR | 10-2012-0011765 | 2/2012 |

OTHER PUBLICATIONS

Second Office Action for Chinese Patent Application No. CN 201410295402.9, Sep. 12, 2016, 14 Pages.

\* cited by examiner

SHIFT REGISTER WITH MULTIPLE DISCHARGE VOLTAGES

CROSS REFERENCE TO RELATED APPLICATIONS

This application claims the benefit of the Korean Patent Application No. 10-2013-0074206, filed on Jun. 27, 2013 which is hereby incorporated by reference as if fully set forth herein.

BACKGROUND

Field of the Invention

The present invention relates to a shift register and, more particularly, to a shift register capable of reducing size of a display apparatus through reduction in the falling edge time of a scan pulse.

Discussion of the Related Art

In general, a liquid crystal display (LCD) device is adapted to display an image by adjusting light transmittance of a liquid crystal using an electric field. To this end, the LCD device includes a liquid crystal panel having pixel areas arranged in matrix form, and a driving circuit for driving the liquid crystal panel.

In the liquid crystal panel, a plurality of gate lines and a plurality of data lines are arranged to cross each other, and the pixel areas are defined respectively at intersections of the gate lines and the data lines. Also pixel electrodes and a common electrode for applying the electric field to the respective pixel areas are formed in the liquid crystal panel.

Each of the pixel electrodes is connected to an associated one of the data lines via the source electrode and drain electrode of a thin film transistor (TFT), which is a switching device. The TFT is turned on in response to a scan pulse applied to the gate electrode thereof via an associated one of the gate lines, so as to charge a data signal on the associated data line to the pixel electrode.

The driving circuit includes a gate driver for driving the gate lines, a data driver for driving the data lines, a timing controller for supplying control signals for control of the gate driver and data driver, and a power supply for supplying various drive voltages to be used in the LCD device.

The gate driver sequentially supplies scan pulses to the gate lines to sequentially drive liquid crystal cells in the liquid crystal panel on a line-by-line basis. In order to sequentially output the above-mentioned scan pulses, the gate driver includes a shift register.

In a conventional case, the shift register includes a plurality of stages each having a plurality of switching elements.

Each stage includes a buffer as an output unit thereof. The output unit includes output switching elements (buffer transistors) for outputting scan pulses, that is, a pull-up switching element and a pull-down switching element. When such an output switching element is degraded due to prolonged driving thereof, the wavelength of a scan pulse generated from the output switching element may become distorted. For example, the falling edge time of the scan pulse may be increased.

This will be described in detail with reference to FIG. 1.

FIG. 1 is a diagram explaining problems caused by an increase in falling edge time of a scan pulse in a conventional case.

FIG. 1 depicts waveforms of a source output enable signal (SOE) to determine output timing of a data signal Vdata and a scan pulse Vgate output from a shift register. The scan pulse Vgate is supplied to a gate line and controls operation of a pixel switching element connected to the gate line.

When the falling edge time of a scan pulse applied to a gate line connected to a specific pixel is lengthened, the turn-on time of a pixel switching element in the specific pixel is lengthened and a data signal other than a data signal associated with the particular pixel (a data signal associated with a pixel other than the specific pixel) may be input to the specific pixel. As a result, the pixel may display an erroneous image and degradation of picture quality may occur.

The above-mentioned problem may be overcome through an increase in size of output switching elements. However, by increasing the size of the output switching elements, the size of the shift register is also increased. As such, there may be another problem in that the size of the display apparatus equipped with the shift register is increased.

SUMMARY

Accordingly, the present invention is directed to a shift register that substantially obviates one or more problems due to limitations and disadvantages of the related art.

An object of the present invention is to provide a shift register in which an output unit of each stage is divided into a carry output unit and a scan output unit, and discharge voltages having different levels are applied to the carry output unit and scan output unit and, as such, it is possible to prevent lengthening of scan pulses, and to reduce the size of a display apparatus including the shift register.

Additional advantages, objectives, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objectives and other advantages and in accordance with the purpose of the invention, as embodied and broadly described herein, a shift register includes a plurality of stages for sequentially outputting output pulses including carry pulses and scan pulses, wherein each of the stages includes a carry output unit for generating a carry pulse, based on a first discharge voltage and a clock pulse having a low-level voltage with a level equal to the first discharge voltage, and supplying the generated carry pulse to at least one of upstream and downstream ones of the stages, a scan output unit for generating a scan pulse, based on a second discharge voltage having a higher voltage value than the first discharge voltage and the clock pulse, and supplying the generated scan pulse to a corresponding one of gate lines, and a node controller for controlling voltages at nodes, to which the carry output unit and the scan output unit are connected.

The node controller of an n-th one of the stages (n being a natural number) may include a first switching element controlled in accordance with a start pulse from an external source or the carry pulse from an n−x-th one of the stages (x being a natural number), and connected between a charge voltage line transmitting a charge voltage and a set node of the n-th stage, a second switching element controlled in accordance with the carry pulse from an x+y-th stage (y being a natural number), and connected between the set node and a first discharge voltage line transmitting the first discharge voltage, a third switching element controlled in accordance with a first AC voltage from a first AC voltage line, and connected between the first AC voltage line and a first common node, a fourth switching element controlled in accordance with a voltage applied to the set node, and connected between the first common node and the first discharge voltage line, a fifth switching element controlled in accordance with a voltage applied to the first common node, and connected between the first AC voltage line and a first reset node of the n-th stage, a sixth switching element controlled in accordance with the voltage applied to the set node, and connected between the first reset node and the first discharge voltage line, a seventh switching element controlled in accordance with the carry pulse from the n−x-th stage, and connected between the first reset node and the first discharge voltage line, an eighth switching element controlled in accordance with a second AC voltage from a second AC voltage line, and connected between the second AC voltage line and a second common node, a ninth switching element controlled in accordance with the voltage applied to the set node, and connected between the second common node and the first discharge voltage line, a tenth switching element controlled in accordance with a voltage applied to the second common node, and connected between the second AC voltage line and the second reset node, an eleventh switching element controlled in accordance with the voltage applied to the set node, and connected between the second reset node and the first discharge voltage line, a twelfth switching element controlled in accordance with the carry pulse from the n−x-th stage, and connected between the second reset node and the first discharge voltage line, a thirteenth switching element controlled in accordance with a voltage applied to the first reset node, and connected between the set node and the first discharge voltage line, and a fourteenth switching element controlled in accordance with a voltage applied to the second reset node, and is connected between the set node and the first discharge voltage line.

The node controller in each of the stages other than the stages receiving the start pulse via the first switching element may further include a fifteenth switching element controlled in accordance with the start pulse, and connected between the set node and the first discharge voltage line.

The start pulse may be supplied to the first switching element of each of first to x-th ones of the stages. The node controller in each of the stages other than the first to x-th stages may further include the fifteenth switching element.

The carry output unit of an n-th one of the stages (n being a natural number) may include a carry pull-up switching element controlled in accordance with a voltage applied to a set node of the n-th stage, and connected between a clock transmission line to transmit the clock pulse and a carry output terminal of the n-th stage, a first carry pull-down switching element controlled in accordance with a voltage applied to a first reset node of the n-th stage, and connected between the carry output terminal of the n-th stage and a first discharge voltage line to transmit the first discharge voltage, and a second carry pull-down switching element controlled in accordance with a voltage applied to a second reset node of the n-th stage, and connected between the carry output terminal of the n-th stage and the first discharge voltage line. The carry output terminal of the n-th stage may be connected to an n+x-th one of the stages (x being a natural number) and an n−y-th one of the stages (y being a natural number).

The scan output unit of an n-th one of the stages (n being a natural number) may include a scan pull-up switching element controlled in accordance with a voltage applied to a set node of the n-th stage, and connected between a clock transmission line to transmit the clock pulse and a scan output terminal of the n-th stage, a first scan pull-down switching element controlled in accordance with a voltage applied to a first reset node of the n-th stage, and connected between the scan output terminal of the n-th stage and a second discharge voltage line to transmit the second discharge voltage, and a second scan pull-down switching element controlled in accordance with a voltage applied to a second reset node of the n-th stage, and connected between the scan output terminal of the n-th stage and the second discharge voltage line. The scan output terminal of the n-th stage may be connected to an n-th one of the gate lines.

The clock pulse may be one of first to sixth clock pulses having different phases.

Each of the first to sixth clock pulses may have a pulse width corresponding to three horizontal periods. The pulse widths of sequential ones of the clock pulses may overlap with each other for a predetermined period.

The overlap period may correspond to two horizontal periods.

In some embodiments, x is 3, and y is 4 or 5.

It is to be understood that both the foregoing general description and the following detailed description of the present invention are exemplary and explanatory and are intended to provide further explanation of the invention as claimed.

The shift register according to the present invention has the following effects.

First, it may be possible to reduce the leakage current from the scan pull-up switching element, using two discharge voltages having different levels.

Second, it may be possible to reduce the leakage current in a disable period by supplying a relatively low discharge voltage generated from the carry output unit to the gate electrode of the first switching element in each stage.

Third, it may be possible increase the margin between scan pulses because the falling edge time of the scan pulse supplied to the associated gate line may be reduced. Accordingly, pull-up switching elements and pull-down switching elements without large sizes for reduction of the falling edge time of scan pulses may be used and, as such, it may be possible to considerably reduce size of the shift register. In addition, it may be possible to reduce bezel size of the display apparatus.

BRIEF DESCRIPTION OF THE DRAWINGS

The accompanying drawings, which are included to provide a further understanding of the invention and are incorporated in and constitute a part of this application, illustrate embodiment(s) of the invention and along with the description serve to explain the principle of the invention. In the drawings.

DETAILED DESCRIPTION

Reference will now be made in detail to the preferred embodiments of the present invention, examples of which are illustrated in the accompanying drawings.

Figure 1:
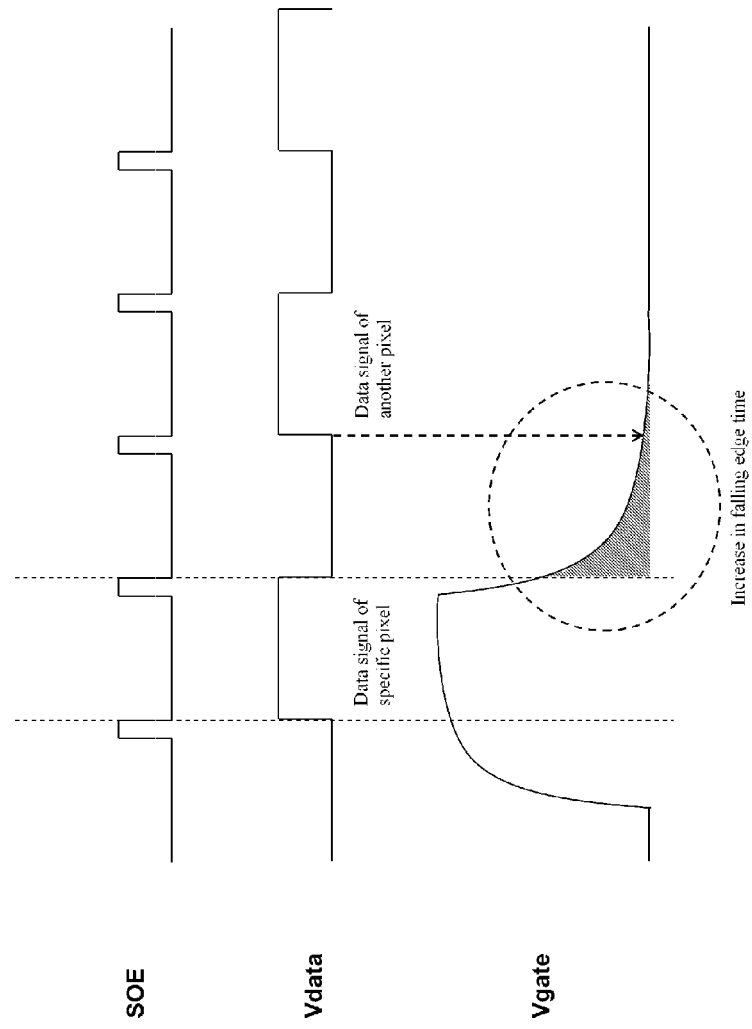
FIG. 1 is a diagram explaining problems caused by an increase in falling edge time of a scan pulse in a conventional case.
Figure 2:
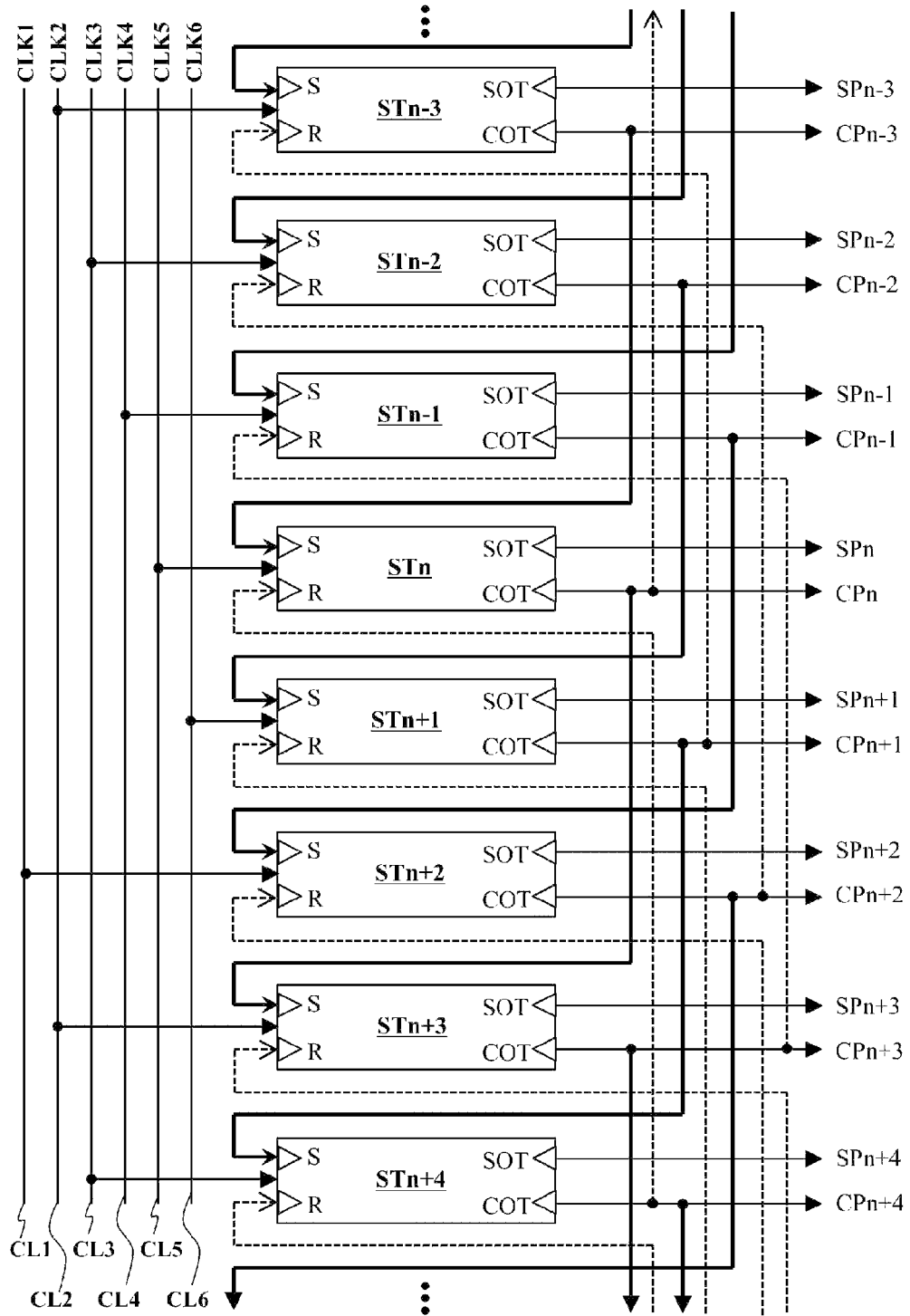
FIG. 2 is a diagram illustrating a shift register according to an embodiment.
Figure 3:
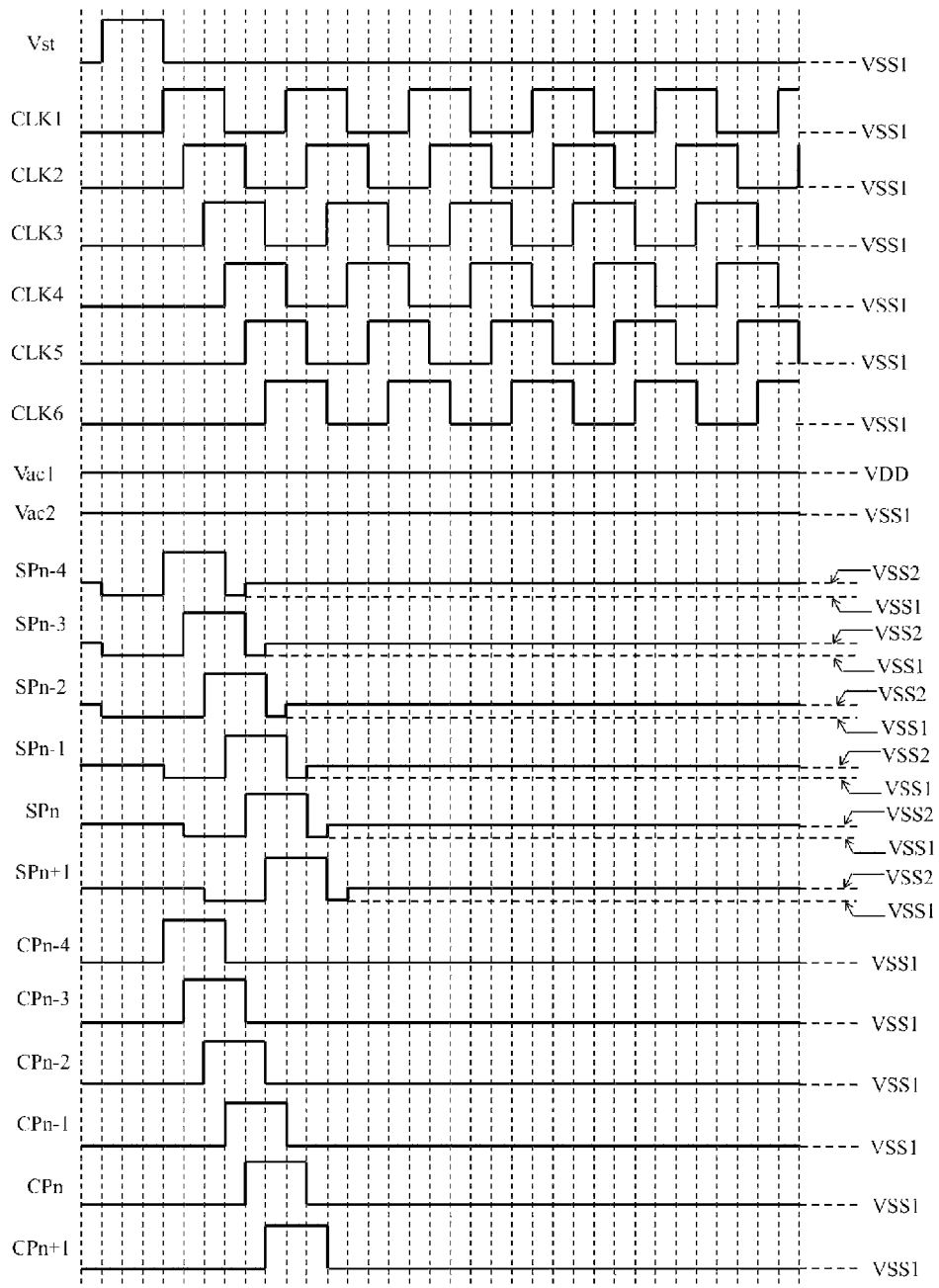
FIG. 3 is a timing diagram of various signals supplied to or output from stages included in the shift register of FIG. 2.

FIG. 2 is a diagram illustrating a shift register according to an embodiment. FIG. 3 is a timing diagram of various signals supplied to or output from stages included in the shift register of FIG. 2.

As illustrated in FIG. 2, the shift register includes a plurality of stages. For instance, FIG. 2 shows stages STn−3 to STn+4.

The stages output pulses in a sequential manner. That is, the stages . . . , STn−3 to STn+4, . . . output pulses in a sequentially manner in order from the first stage to the last stage (hereinafter, referred to an "m-th stage"), respectively. In detail, each of the stages . . . , STn−3 to STn+4, . . . includes a scan output terminal SOT and a carry output terminal COT. Each of the stages . . . , STn−3 to STn+4, . . . outputs a corresponding one of scan pulses SP1 to SPn once in one frame period through the scan output terminal SOT thereof. Each of the stages . . . , STn−3 to STn+4, . . . also outputs a corresponding one of carry pulses CP1 to CPn once in one frame period through the carry output terminal COT thereof.

With regard to one frame period, the first one of the m stages first outputs a scan pulse and a carry pulse, and the m-th one of the m stages outputs a scan pulse and a carry pulse last. Here, "i" of the term "i-th stage", which will be described hereinafter, does not mean a position order representing the position of the i-th stage, but means an output order of the scan pulse (or carry pulse) output from the i-th stage, namely, an i-th output order. For example, the second stage is a stage which outputs a scan pulse (or carry pulse) second in one frame period, as compared to the remaining stages. The output timing of the scan pulse from the second stage is later than that of the first stage, but earlier than that of the third stage.

The scan pulse and carry pulse output from one stage are generated, based on the same clock pulse. Accordingly, the scan pulse and carry pulse output from one stage have the same phase. That is, the scan pulse and carry pulse generated from one stage are simultaneously output.

Each of the stages . . . , STn−3 to STn+4, . . . drives the gate line connected thereto, using the scan pulse thereof.

Each of the stages . . . , STn−3 to STn+4, . . . controls operation of at least one of a downstream stage having a later output order than the subject stage and an upstream stage having an earlier output order than the subject stage, using a carry pulse.

For example, the n-th stage STn generates a carry pulse CPn, and supplies the carry pulse CPn to a set terminal S of the n+3-th stage STn+3 having a later output order than the n-th stage STn and a reset terminal R of the n−4-th stage STn−4 having an earlier output order than the n-th stage STn. The n+3-th stage STn+3 is set by the carry pulse CPn, whereas the n−4-th stage STn−4 is reset by the carry pulse CPn.

There is no third upstream stage associated with the first stage and a start pulse Vst from a timing controller is input to a set terminal S of the first stage. Similarly, there is no third upstream stage associated with each of the second and third stages and each of the second and third stages receives the start pulse Vst through a set terminal thereof. For example, when the n−4-th stage (not shown) is the first stage, the n−3-th stage STn−3 and n−2-th stage STn−2, in addition to the n−4-th stage (not shown), receive the start pulse Vst and, as such, the n−3-th stage STn−3, the n−2-th stage STn−2, and the n−4-th stage are set. Thus, as illustrated in FIG. 3, n−4-th, n−3-th, and n−2-th scan pulses SPn−4, SPn−3, and SPn−2 are the same in terms of a level falling time from a second discharge voltage VSS2 to a first discharge voltage VSS1.

If the n+5-th stage (not shown) is the last stage, the shift register further includes a first dummy stage for outputting a first dummy pulse to reset the n+2-th stage, a second dummy stage for outputting a second dummy pulse to reset the n+3-th stage, a third dummy stage for outputting a third dummy pulse to reset the n+4-th stage, and a fourth dummy stage for outputting a fourth dummy pulse to reset the n+5-th stage.

The first to fourth dummy stages are not connected to any gate line. Accordingly, the dummy pulses from the dummy stages are only supplied to the above described stages without being supplied to any gate line.

Each of the first to fourth dummy stages are set in accordance with a carry pulse from the n+3-th stage, a carry pulse from the n+4-th stage, a carry pulse from the n+5-th stage, and a first dummy pulse from the first dummy stage, respectively. That is, the n+3-th carry pulse CPn+3 is input to a set terminal of the first dummy stage, the n+4-th carry pulse CPn+4 is input to a set terminal of the second dummy stage, the n+5 carry pulse is input to a set terminal of the third dummy stage, and the first dummy pulse of the first dummy stage is input to a set terminal of the fourth dummy stage.

The first to fourth dummy stages are reset in accordance with the start pulse from the timing controller. The start pulse Vst from the timing controller is input to each reset terminal R of the first to fourth dummy stages.

Each of the first to fourth dummy stages only generates a dummy pulse corresponding to a carry pulse without generating a scan pulse. Accordingly, scan output terminals SOT of the dummy stages may be removed.

The shift register having the above described configuration may be incorporated in various display apparatuses each including a liquid crystal panel. For example, the liquid crystal panel includes a display portion for displaying an image, and a non-display portion surrounding the display portion, and the shift register may be incorporated in the non-display portion of the liquid crystal panel.

Each of the stages of the shift register having the above described configuration, that is, each of the stages . . . , STn−3 to STn+4, . . . and first to fourth dummy stages, receives a charge voltage VDD, a first discharge voltage VSS1, a second discharge voltage VSS2, a first AC voltage Vac1, a second AC voltage Vac2, and one of first to sixth clock pulses CLK1 to CLK6 output in a circulating manner while having a phase difference between sequential clocks. The first to third stages additionally receive the start pulse Vst.

The charge voltage VDD is mainly used to charge nodes of the stages . . . , STn−3 to STn+4, . . . and first to fourth dummy stages. The first discharge voltage VSS1 is mainly used to discharge the nodes and carry output terminals COT of the stages . . . , STn−3 to STn+4, . . . and first to fourth dummy stages. The second discharge voltage VSS2 is mainly used to discharge the scan output terminals SOT of the stages . . . , STn−3 to STn+4, . . . and first to fourth dummy stages.

The charge voltage VDD and second discharge voltage VSS2 are DC voltages. However, the charge voltage VDD has positive polarity, whereas the second discharge voltage VSS2 has negative polarity. The second discharge voltage VSS2 may be a ground voltage. The first discharge voltage VSS1 may be a DC voltage. The first discharge voltage VSS1 has a lower value than the second discharge voltage VSS2. The low-level voltage value of each of the clock pulses CLK1 to CLK6 is equal to the voltage value of the first discharge voltage VSS1. For example, the charge voltage VDD may be set to 28V, the first discharge voltage VSS1 may be set to −10V, and the second discharge voltage VSS2 may be set to −5V.

The first and second AC voltages Vac1 and Vac2 are AC signals for mainly controlling charge and discharge of the reset nodes of the stages . . . , STn−3 to STn+4, . . . and first to fourth dummy stages. For example, the first AC voltage Vac1 has a waveform phase-shifted 180° from that of the second AC voltage Vac2. Each of the first and second AC voltages Vac1 and Vac2 may have a high-level voltage value equal to that of the charge voltage VDD. Each of the first and second AC voltages Vac1 and Vac2 may have a low-level voltage value equal to that of the first or second discharge voltage VSS1 or VSS2. The levels of the first and second AC voltages Vac1 and Vac2 are inverted at intervals of p frame periods (p being a natural number).

The first to sixth clock pulses CLK1 to CLK6 are signals used to generate scan pulses . . . , SPn−3 to SPn+4, . . . , carry pulses . . . , CPn−3 to CPn+4, . . . , and dummy pulses of the stages . . . , STn−3 to STn+4, . . . and first to fourth dummy stages. Each of the stages . . . , STn−3 to STn+4, . . . and first to fourth dummy stages receives one of the first to sixth clock pulses CLK1 to CLK6 and generates and outputs corresponding ones of the scan pulses . . . , SPn−3 to SPn+4, . . . , carry pulses . . . , CPn−3 to CPn+4, . . . , and dummy pulses. For example, as illustrated in FIG. 2, each of the 6d+1-th stages (for example, STn+2) outputs a scan pulse and a carry pulse, using the first clock pulse CLK1, each of the 6d+2-th stages (for example, STn−3) outputs a scan pulse and a carry pulse, using the second clock pulse CLK2, each of the 6d+3-th stages (for example, STn−2) outputs a scan pulse and a carry pulse, using the third clock pulse CLK3, each of the 6d+4-th stages (for example, STn−1) outputs a scan pulse and a carry pulse, using the fourth clock pulse CLK4, each of the 6d+5-th stage (for example, STn) outputs a scan pulse and a carry pulse, using the fifth clock pulse CLK5, and each of the 6d+6-th stage (for example, STn+1) outputs a scan pulse and a carry pulse, using the sixth clock pulse CLK6.

Although an example of using six clock pulses having different phases is illustrated, any number of different clock pulses may be used, as long as the number of different clock pulses is two or more.

As illustrated in FIG. 3, the first to sixth clock pulses CLK1 to CLK6 are sequentially output while having a phase difference between sequential clocks. In this case, each clock pulse has a pulse width corresponding to three horizontal periods. The pulse widths of sequential ones of the clock pulses CLK1 to CLK6 overlap with each other for a period corresponding to two horizontal periods. For example, as illustrated in FIG. 3, the pulse widths of the first and second clock pulses CLK1 and CLK2, which are sequentially output at different times, overlap with each other. That is, the pulse width of the first clock pulse CLK1 corresponding to latter two horizontal periods overlaps with the pulse width of the second clock pulse CLK2 corresponding to former two horizontal periods.

As described above, the first to sixth clock pulses CLK1 to CLK6 are sequentially output in a circulating manner. One group of first to sixth clock pulses CLK1 to CLK6 is sequentially output, and then another group of first to sixth clock pulses CLK1 to CLK6 is sequentially output. That is, the first to sixth clock pulses CLK1 to CLK6 are repeatedly output in a sequential manner. Thus, the first clock pulse CLK1 in a current circulation period is output in a period between a time when the sixth clock pulse CLK6 in a previous circulation period is output and a time when the second clock pulse CLK2 in the current circulation period is output.

As illustrated in FIG. 3, the start pulse Vst has a pulse width corresponding to three horizontal periods. The start pulse Vst is output earlier than the first to sixth clock pulses CLK1 to CLK6 and does not overlap with the first to sixth pulses CLK1 to CLK6. The start pulse Vst may have a high-level voltage value equal to that of the charge voltage VDD while having a low-level voltage value equal to that of the first or second discharge voltage VSS1 or VSS2.

Each of the first to sixth clock pulses CLK1 to CLK6 is output several times per frame period. However, the start pulse Vst is output once per frame period. In other words, each of the first to sixth clock pulses CLK1 to CLK6 periodically exhibits an active state (high-level state) several times per frame period, whereas the start pulse Vst exhibits an active state once per frame period.

In order to enable each of the stages . . . , STn−3 to STn+4, and first to fourth dummy stages to output associated ones of the scan pulses and carry pulses or an associated one of the dummy pulses, an operation to enable the subject stage is first executed. Here, enabling of a stage means that the stage is set to an output enable state, that is, a state in which the stage can output a clock pulse supplied thereto as a scan pulse. To this end, each of the stages . . . , STn−3 to STn+4, . . . and first to fourth dummy stages is enabled by a carry pulse supplied thereto from a stage arranged upstream thereof, namely, an upstream stage, which generates an output (a scan pulse or carry pulse), earlier than the subject stage.

For example, the n-th stage is enabled in response to a carry pulse from the n−3-th stage. Since there are no negative stages, there is no third upstream stage in association with each of the first stage, second stage, and third stage and the first to third stages are enabled in response to the start pulse Vst from the timing controller.

In addition, each of the stages . . . , STn−3 to STn+4, . . . and first to fourth dummy stages is disabled in response to a carry pulse from a stage arranged downstream thereof, namely, a downstream stage, which generates an output, later than the subject stage. Here, disabling of a stage means that the stage is reset to an output disable state, that is, a state in which the stage cannot output a clock pulse supplied thereto, as a scan pulse and a carry pulse.

For example, the n-th stage STn is disabled in response to a carry pulse from the n+4-th stage STn+4. In another example, the n-th stage STn may be disabled in response to the carry pulse CPn+5 from the n+5-th stage STn+5, in place of the n+4-th stage STn+4.

When the n+5-th stage (not shown) is the last stage, since there is no fourth downstream stage in association with each of the n+5-th stage, n+4-th stage, n+3-th stage, and n+2-th stage, these stages are disabled by the start pulse Vst from the timing controller.

Hereinafter, the configuration of each of the stages . . . , STn−3 to STn+4, . . . and first to fourth dummy stages in the shift register configured as described above will be described in more detail.

Figure 4:
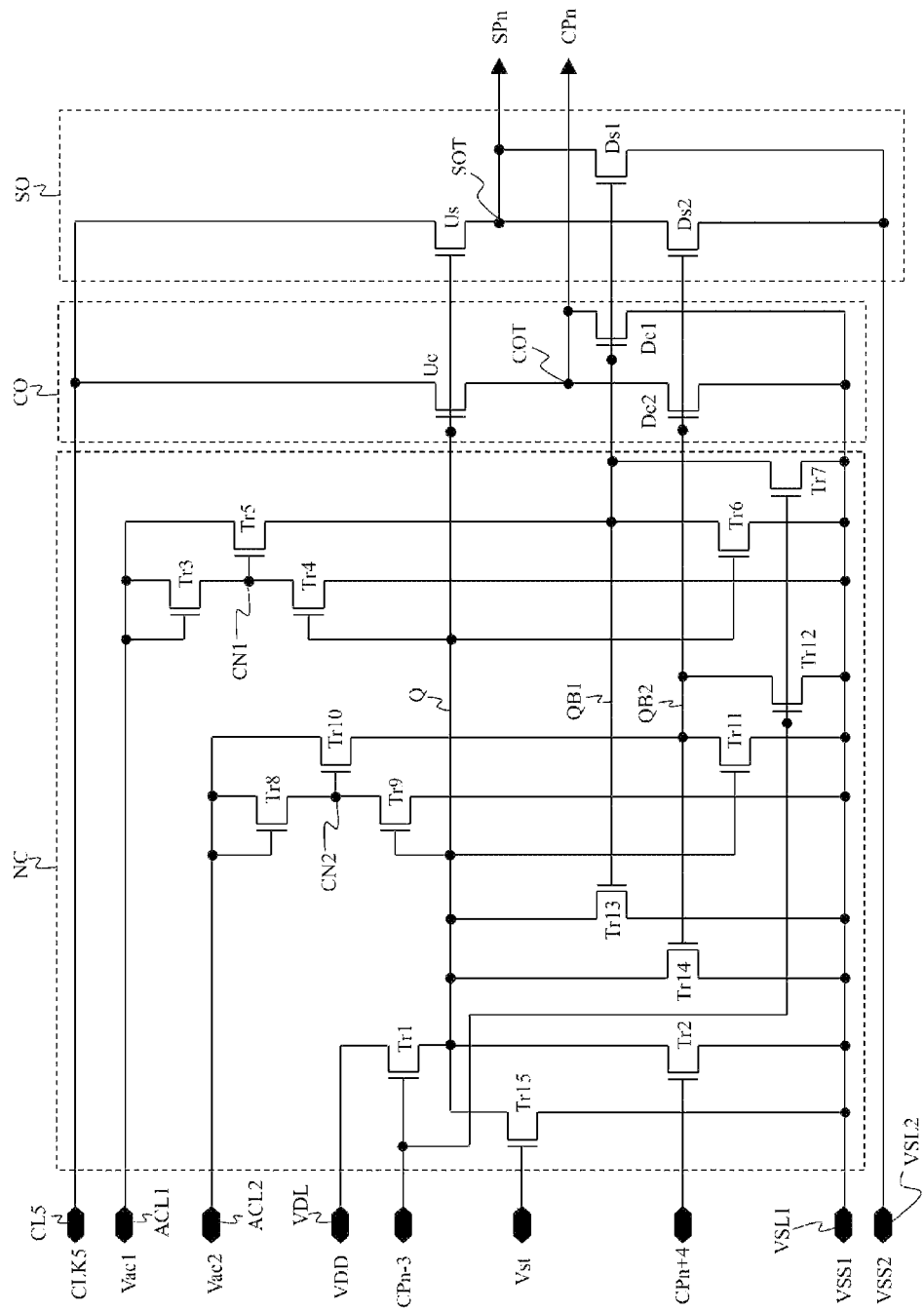
FIG. 4 is a diagram illustrating a configuration of an n-th one of the stages illustrated in FIG. 2

FIG. 4 is a diagram illustrating a configuration of an n-th one of the stages illustrated in FIG. 2.

As illustrated in FIG. 4, the n-th stage STn includes a set node Q, a first reset node QB1, a second reset node QB2, a node controller NC, a carry output unit CO, and a scan output unit SO.

The node controller NC of the n-th stage STn controls signal states of the set node Q, first reset node QB1, and second reset node QB2.

For example, as illustrated in FIG. 4, the node controller NC of the n-th stage includes first to fifteenth switch elements Tr1 to Tr15. Hereinafter, the switching elements will be described in detail.

The first switching element Tr1 included in the n-th stage STn is controlled in accordance with the carry pulse CPn−3 from the n−3-th stage, and is connected between a charge voltage line VDL transmitting the charge voltage VDD and the set node Q of the n-th stage STn. The first switching element Tr1 is turned on or off in accordance with the carry pulse CPn−3. In an ON state, the first switching element Tr1 supplies the charge voltage VDD to the set node Q.

The first switching element Tr1 included in each of the first to third stages is connected, at a gate electrode thereof, to a start transmission line, to which the start pulse Vst is applied.

The second switching element Tr2 included in the n-th stage STn is controlled in accordance with the carry pulse CPn+4 from the n+4-th stage STn+4, and is connected between the set node Q of the n-th stage STn and a first discharge voltage line VSL1 transmitting the first discharge voltage VSS1. The second switching element Tr2 is turned on or off in accordance with the carry pulse CPn+4. In an ON state, the second switching element Tr2 supplies the first discharge voltage VSS1 to the set node Q.

When the n+5-th stage (not shown) is the last stage, the gate electrode of the second switching element Tr2 included in the n+2-th stage is connected to the carry output terminal of the first dummy stage. The gate electrode of the second switching element Tr2 included in the n+3-th stage is connected to the carry output terminal of the second dummy stage. The gate electrode of the second switching element Tr2 included in the n+4-th stage is connected to the carry output terminal of the third dummy stage. The gate electrode of the second switching element Tr2 included in the n+5 stage is connected to the carry output terminal of the fourth dummy stage.

The gate electrode of the second switching element Tr2 included in the first dummy stage, the gate electrode of the second switching element Tr2 included in the second dummy stage, the gate electrode of the second switching element Tr2 included in the third dummy stage, and the gate electrode of the second switching element Tr2 included in the fourth dummy stage are connected to the start transmission line to transmit the start pulse Vst. In this case, each of the first to fourth dummy stages may selectively include one of the second switching element Tr2 and fifteenth switching element Tr15.

The third switching element Tr3 included in the n-th stage STn is controlled in accordance with the first AC voltage Vac1 from a first AC voltage line ACL1, and is connected between the first AC voltage line ACL1 and a first common node CN1. The third switching element Tr3 is turned on or off in accordance with the first AC voltage Vac1. In an ON state, the third switching element Tr3 supplies the first AC voltage Vac1 to the first common node CN1.

The fourth switching element Tr4 included in the n-th stage STn is controlled in accordance with a voltage applied to the set node Q of the n-th stage STn, and is connected between the first common node CN1 and the first discharge voltage line VSL1. The fourth switching element Tr4 is turned on or off in accordance with a voltage applied to the set node Q. In an ON state, the fourth switching element Tr4 supplies the first discharge voltage VSS1 to the first common node CN1.

The fifth switching element Tr5 included in the n-th stage STn is controlled in accordance with a voltage applied to the first common node CN1, and is connected between the first AC voltage line ACL1 and the first reset node QB1 of the n-th stage STn. The fifth switching element Tr5 is turned on or off in accordance with a voltage applied to the first common node CN1. In an ON state, the fifth switching element Tr5 supplies the first AC voltage Vac1 to the first reset node QB1.

The sixth switching element Tr6 included in the n-th stage STn is controlled in accordance with the voltage applied to the set node Q of the n-th stage STn, and is connected between the first reset node QB1 of the n-th stage STn and the first discharge voltage line VSL1. The sixth switching element Tr6 is turned on or off in accordance with a voltage applied to the set node Q. In an ON state, the sixth switching element Tr6 supplies the first discharge voltage VSS1 to the first reset node QB1.

The seventh switching element Tr7 included in the n-th stage STn is controlled in accordance with the carry pulse CPn−3 from the n−3-th stage STn−3, and is connected between the first reset node QB1 of the n-th stage STn and the first discharge voltage line VSL1. The seventh switching element Tr7 is turned on or off in accordance with the carry pulse CPn−3. In an ON state, the seventh switching element Tr7 supplies the first discharge voltage VSS1 to the first reset node QB1.

The seventh switching element Tr7 included in each of the first to third stages is connected, at the gate electrode thereof, to the start transmission line, to which the start pulse Vst is applied.

The eighth switching element Tr8 included in the n-th stage STn is controlled in accordance with the second AC voltage Vac2 from a second AC voltage line ACL2, and is connected between the second AC voltage line ACL2 and a second common node CN2. The eighth switching element Tr8 is turned on or off in accordance with the second AC voltage Vac2. In an ON state, the eighth switching element Tr8 supplies the second AC voltage Vac2 to the second common node CN2.

The ninth switching element Tr9 included in the n-th stage STn is controlled in accordance with the voltage applied to the set node Q of the n-th stage STn, and is connected between the second common node CN2 and the first discharge voltage line VSL1. The ninth switching element Tr9 is turned on or off in accordance with the voltage applied to the set node Q. In an ON state, the ninth switching element Tr9 supplies the first discharge voltage VSS1 to the second common node CN2.

The tenth switching element Tr10 included in the n-th stage STn is controlled in accordance with a voltage applied to the second common node CN2, and is connected between the second AC voltage line ACL2 and the second reset node QB2 of the n-th stage STn. The tenth switching element Tr10 is turned on or off in accordance with a voltage applied to the second common node CN2. In an ON state, the tenth switching element Tr10 supplies the second AC voltage Vac2 to the second reset node QB2.

The eleventh switching element Tr11 included in the n-th stage STn is controlled in accordance with the voltage applied to the set node Q of the n-th stage STn, and is connected between the second reset node QB2 and the first discharge voltage line VSL1. The eleventh switching element Tr11 is turned on or off in accordance with the voltage applied to the set node Q. In an ON state, the eleventh switching element Tr11 supplies the first discharge voltage VSS1 to the second reset node QB2.

The twelfth switching element Tr12 included in the n-th stage STn is controlled in accordance with the carry pulse CPn−3 from the n−3-th stage STn−3, and is connected between the second reset node QB2 of the n-th stage STn and the first discharge voltage line VSL1. The twelfth switching element Tr12 is turned on or off in accordance with the carry pulse CPn−3. In an ON state, the twelfth switching element Tr12 supplies the first discharge voltage VSS1 to the second reset node QB2.

The twelfth switching element Tr12 included in each of the first to third stages is connected, at the gate electrode thereof, to the start transmission line, to which the start pulse Vst is applied.

The thirteenth switching element Tr13 included in the n-th stage STn is controlled in accordance with a voltage applied to the first reset node QB1 of the n-th stage STn, and is connected between the set node Q and the first discharge voltage line VSL1. The thirteenth switching element Tr13 is turned on or off in accordance with the voltage applied to the first reset node QB1. In an ON state, the thirteenth switching element Tr13 supplies the first discharge voltage VSS1 to the set node Q.

The fourteenth switching element Tr14 included in the n-th stage STn is controlled in accordance with a voltage applied to the second reset node QB2 of the n-th stage STn, and is connected between the set node Q and the first discharge voltage line VSL1. The fourteenth switching element Tr14 is turned on or off in accordance with the voltage applied to the second reset node QB2. In an ON state, the fourteenth switching element Tr14 supplies the first discharge voltage VSS1 to the set node Q.

The fifteenth switching element Tr15 included in the n-th stage STn is controlled in accordance with the start pulse Vst, and is connected between the set node Q and the first discharge voltage line VSL1. The fifteenth switching element Tr15 is turned on or off in accordance with the start pulse Vst. In an ON state, the fifteenth switching element Tr15 supplies the first discharge voltage VSS1 to the set node Q.

The fifteenth switching element Tr15 is not included in all stages, but is included in specific stages. The specific stages are stages other than the stages, to which the start pulse Vst is supplied via the first switching element Tr1. For example, each of the first to thirteenth stages performs a set operation in accordance with the start pulse Vst supplied to the first switching element Tr1 thereof. Each of the first to third stages does not include the fifteenth switching element Tr 15, and the fifteenth switching element Tr15 is only included in the stages (including the dummy stages) other than the first to third stages. As described above, each of the first to fourth dummy stages may selectively include only one of the second switching element Tr2 and fifteenth switching element Tr15.

The carry output unit CO and scan output unit SO of each of the stages . . . , STn−3 to STn+4, . . . and first to fourth dummy stages are electrically connected to the above described set node Q, first reset node QB1, and second reset node QB2. Accordingly, the carry output unit CO and scan output unit SO operate under control of the node controller NC.

The carry output unit CO included in each of the stages . . . , STn−3 to STn+4, . . . and first to fourth dummy stages includes a carry output terminal COT, a carry pull-up switching element Uc, a first carry pull-down switching element Dc1 , and a second carry pull-down switching element Dc2.

The carry pull-up switching element Uc included in the carry output unit CO of the n-th stage STn is controlled in accordance with a signal state of the set node Q of the n-th stage STn, and is connected between a clock transmission line transmitting one of the first to sixth clock pulses CLK1 to CLK6, for example, a clock transmission line CL5 transmitting the fifth clock pulse CLK5, and the carry output terminal COT of the n-th stage STn. The carry pull-up switching element Uc is turned on or off in accordance with the voltage at the set node Q. In an ON state, the carry pull-up switching element Uc supplies the clock pulse CLK5 to the carry output terminal COT.

The first carry pull-down switching element Dc1 included in the carry output unit CO of the n-th stage STn is controlled in accordance with a signal state of the first reset node QB1 of the n-th stage STn, and is connected between the carry output terminal COT of the n-th stage STn and the first discharge voltage line VSL1. The first carry pull-down switching element Dc1 is turned on or off in accordance with the voltage at the first reset node QB1. In an ON state, the first carry pull-down switching element Dc1 supplies the first discharge voltage VSS1 to the carry output terminal COT.

The second carry pull-down switching element Dc2 included in the carry output unit CO of the n-th stage STn is controlled in accordance with a signal state of the second reset node QB2 of the n-th stage STn, and is connected between the carry output terminal COT of the n-th stage STn and the first discharge voltage line VSL1. The second carry pull-down switching element Dc2 is turned on or off in accordance with the voltage at the second reset node QB2. In an ON state, the second carry pull-down switching element Dc2 supplies the first discharge voltage VSS1 to the carry output terminal COT.

The scan output unit SO included in each of the stages . . . , STn−3 to STn+4, . . . and first to fourth dummy stages includes a scan output terminal SOT, a scan pull-up switching element Us, a first scan pull-down switching element Ds1, and a second scan pull-down switching element Ds2.

The scan output unit SO included in the n-th stage STn outputs a scan pulse or the second discharge voltage VSS2 through the scan output terminal SOT. The scan output terminal SOT is electrically connected to the corresponding gate line. Accordingly, the scan pulse or second discharge voltage VSS2 from the scan output unit SO included in the n-th stage STn is supplied to the n-th gate line.

The scan pull-up switching element Us included in the scan output unit SO of the n-th stage STn is controlled in accordance with a signal state of the set node Q of the n-th stage STn, and is connected between a clock transmission line to transmit one of the first to sixth clock pulses CLK1 to CLK6 , for example, the clock transmission line CL5 to transmit the fifth clock pulse CLK5, and the scan output terminal SOT of the n-th stage STn. The scan pull-up switching element Us is turned on or off in accordance with the voltage at the set node Q. In an ON state, the scan pull-up switching element Us supplies the clock pulse CLK5 to the scan output terminal SOT. The scan pull-up switching element Us and carry pull-up switching element Uc included in the n-th stage STn receive the same clock pulse (for example, CL5).

The first scan pull-down switching element Ds1 included in the scan output unit SO of the n-th stage STn is controlled in accordance with a signal state of the first reset node QB1 of the n-th stage STn, and is connected between the scan output terminal SOT and the second discharge voltage line VSL2 to transmit the second discharge voltage VSS2. The first scan pull-down switching element Ds1 is turned on or off in accordance with the voltage applied to the first reset node QB1. In an ON state, the first scan pull-down switching element Ds1 supplies the second discharge voltage VSS2 to the scan output terminal SOT.

The second scan pull-down switching element Ds2 included in the scan output unit SO of the n-th stage STn is controlled in accordance with a signal state of the second reset node QB2 of the n-th stage STn, and is connected between the scan output terminal COT of the n-th stage STn and the second discharge voltage line VSL2. The second scan pull-down switching element Ds2 is turned on or off in accordance with the voltage applied to the second reset node QB2. In an ON state, the second scan pull-down switching element Ds2 supplies the second discharge voltage VSS2 to the scan output terminal SOT.

Each of the first to fourth dummy stages may only include the carry output unit CO without including the scan output unit SO. That is, the scan output unit SO may be removed from each of the first to fourth dummy stages.

Hereinafter, operation of the shift register configured as described above will be described with reference to FIGS. 4 and 5.

Figure 5:
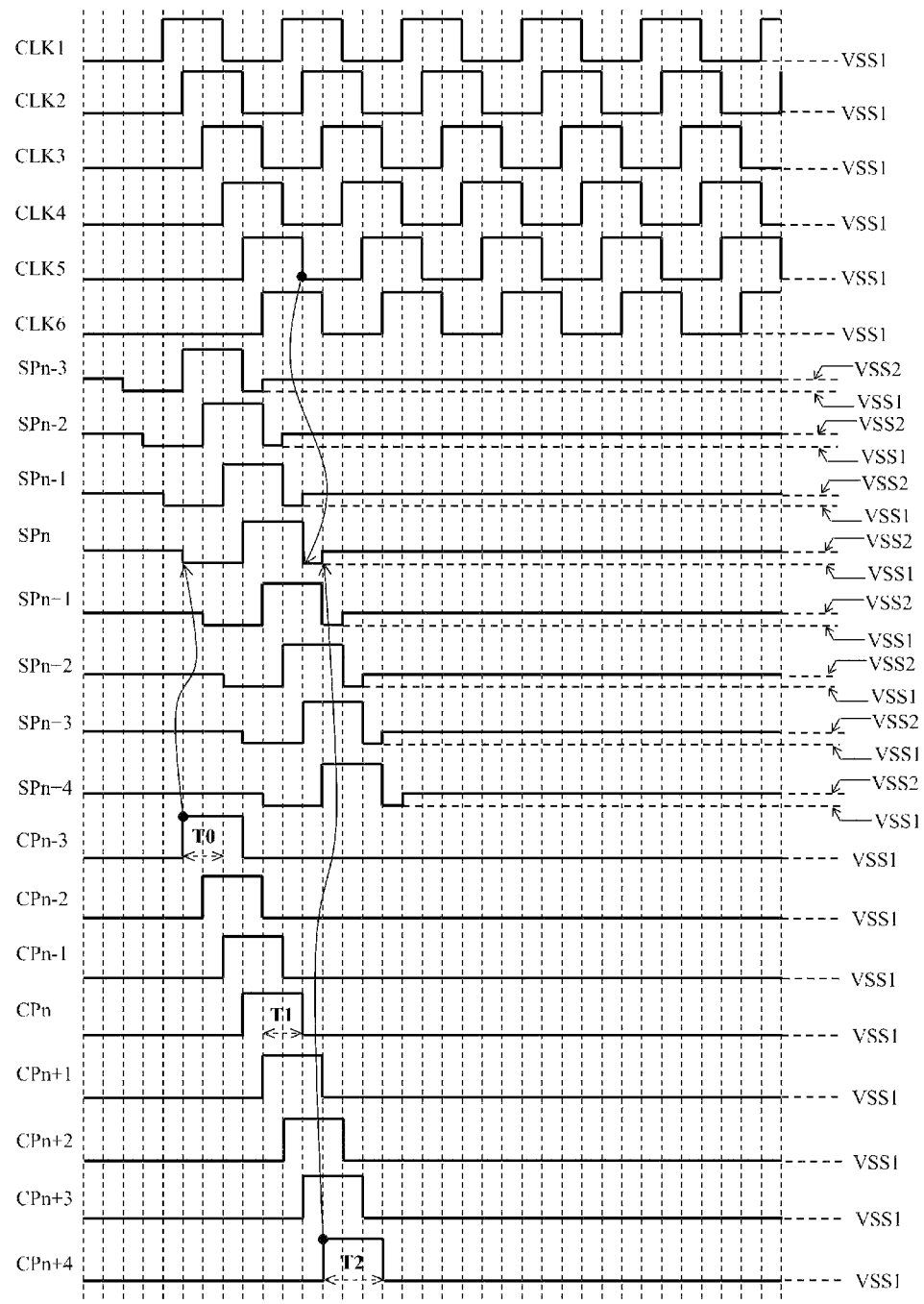
FIG. 5 is a timing diagram of first to sixth clock pulses, n−2-th to n+4-th scan pulses, and n−2-th to n+4-th carry pulses.

FIG. 5 is a timing diagram of first to sixth clock pulses, n–2-th to n+4-th scan pulses, and n–2-th to n+4-th carry pulses.

First, operation of the n-th stage STn in an initial period T0 included in a first frame period will be described. During the first frame period, the first AC voltage Vac1 exhibits positive polarity (VDD level), and the second AC voltage Vac2 exhibits negative polarity (VSS1 level).

Initial Period (T0)

The initial period T0 is a period corresponding to the set period of the n-th stage STn. In the initial period T0, as illustrated in FIGS. 4 and 5, a high-level third carry pulse CPn–3 output from the n–3-th stage STn–3 is input to the n-th stage STn.

That is, the n–3-th carry pulse CPn–3 is supplied to the gate electrodes of the first switching element Tr1, twelfth switching element Tr12, and seventh switching element Tr7 included in the n-th stage STn. Then, the first switching element Tr1, twelfth switching element Tr12, and seventh switching element Tr7 are turned on and, as such, the charge voltage VDD is applied to the set node Q through the turned-on first switching element Tr1. As a result, the set node Q is charged and, as such, the carry pull-up switching element Uc, scan pull-up switching element Us, ninth switching element Tr9, eleventh switching element Tr11, fourth switching element Tr4, and sixth switching element Tr6 of the n-th stage STn, which are connected, at the gate electrodes thereof, to the charged set node Q, are turned on.

In this case, the first discharge voltage VSS1 is supplied to the first reset node QB1 of the n-th stage STn through the turned-on sixth switching element Tr6 and seventh switching element Tr7 and, as such, the first reset node QB1 is discharged. The first discharge voltage VSS1 is also supplied to the second reset node QB2 of the n-th stage STn through the turned-on eleventh switching element Tr11 and twelfth switching element Tr12 and, as such, the second reset node QB2 is discharged.

As a result, the thirteenth switching element Tr13, first carry pull-down switching element Dc1, and first scan pull-down switching element Ds1 of the n-th stage STn, which are connected, at the gate electrodes thereof, to the discharged first reset node QB1, are turned off. In addition, the fourteenth switching element Tr14, second carry pull-down switching element Dc2, and second scan pull-down switching element Ds2 of the n-th stage STn, which are connected, at the gate electrodes thereof, to the discharged second reset node QB2, are turned off.

The first AC voltage Vac1, which is maintained in positive polarity state during the first frame period, is applied to the gate electrode of the third switching element Tr3 included in the n-th stage STn and the third switching element Tr3 is maintained in an ON state during the first frame period. The positive first AC voltage Vac1 is applied to the gate electrode of the fifth switching element Tr5 via the turned-on third switching element Tr3. In this case, the first discharge voltage VSS1 output through the turned-on fourth switching element Tr4 is also supplied to the gate electrode of the fifth switching element Tr5. That is, both the positive first AC voltage Vac1 and the negative first discharge voltage VSS1 are supplied to the gate electrode of the fifth switching element Tr5.

In this case, however, the gate voltage (voltage at the gate electrode) of the fifth switching element Tr5 is maintained at the first discharge voltage VSS1 because the size of the fourth switching element Tr4 supplying the first discharge voltage VSS1 is set to be greater than the size of the third switching element Tr3 supplying the first AC voltage Vac1. Accordingly, the fifth switching element Tr5 is turned off.

In the initial period T0, a low-level carry pulse CPn and a low-level scan pulse SPn are output from the turned on carry pull-up switching element Uc and scan pull-up switching element Us, respectively. The low-level carry pulse CPn is supplied to the n–4-th stage STn–4 and n+3-th stage STn+3 through the carry output terminal COT. The low-level scan pulse SPn is supplied to the n-th gate line through the scan output terminal SOT. Since both the low-level carry pulse CPn and the low-level scan pulse SPn are generated, based on a low-level fifth clock pulse CLK5, they have the level of the first discharge voltage VSS1. Accordingly, in the initial period T0, the n-th scan pulse SPn transitions from the level of the second discharge voltage VSS2 to the level of the first discharge voltage VSS1, as illustrated in FIG. 5.

In the initial period T0, the second switching element Tr2 of the n-th stage STn is maintained in an OFF state because the carry pulse CPn+4 from the n+4-th stage STn+4 is in a low level state in the initial period T0.

In the first frame period, the second AC voltage Vac2 is maintained at negative polarity state and the eighth switching element Tr8, which receives the second AC voltage Vac2, is maintained in an OFF state during the initial period T0. In addition, since the ninth switching element Tr9 is maintained in an ON state during the initial period T0, as described above, the tenth switching element Tr10 connected, at the gate electrode thereof, to the second common node CN2 is maintained in an OFF state during the initial period T0.

Since the start pulse Vst from the timing controller is in a low level state in the initial period T0, the fifth switching element Tr15 of the n-th stage STn is maintained in an OFF state during the initial period T0.

Thus, in the initial period T0, the n-th stage STn charges the set node Q thereof while discharging the first reset node QB1 and second reset node QB2 thereof. That is, the n-th stage STn is set in the initial period T0. In addition, the level of the low-level n-th scan pulse SPn falls from the level of the second discharge voltage VSS2 to the level of the first discharge voltage VSS1 in the initial period T0.

First Period T1

Next, operation in a first period T1 will be described.

The first period T1 is a period corresponding to an output period of the n-th stage STn. In the first period T1, a high-level fifth clock pulse CLK5 is input to the n-th stage STn.

In this case, the set node Q of the n-th stage STn is kept charged by the charge voltage VDD applied in the initial period T0 and, as such, the carry pull-up switching element Uc and scan pull-up switching element Us of the n-th stage STn are maintained in an ON state. Accordingly, the fifth clock pulse CLK5 is applied to the drain electrodes of the turned-on carry pull-up switching element Uc and scan pull-up switching element Us and the carry pull-up switching element Uc and scan pull-up switching element Us output a carry pulse CPn and a scan pulse SPn, respectively.

In this case, the high-level fifth clock pulse CLK5 output through the carry pull-up switching element Uc is the n-th carry pulse CPn, and the high-level fifth clock pulse CLK5 output through the scan pull-up switching element Us is the n-th scan pulse SPn. The n-th carry pulse CPn is supplied to the n+3-th stage STn+3, to set the n+3-th stage STn+3. The n-th carry pulse CPn is also supplied to the n−4-th stage STn−4, to reset the n−4-th stage STn−4. The n-th scan pulse SPn is supplied to the n-th gate line, to drive the n-th gate line.

Since the first switching element Tr1 is turned off in the first period T1, thereby causing the set node Q to be maintained in a floated state, the voltage at the set node Q is boot strapped due to a coupling phenomenon according to the high-level fifth clock pulse CLK5 applied in the first period T1. As a result, the carry pulse CPn and scan pulse SPn are stably output.

The n-th carry pulse CPn output from the n-th stage STn is supplied to the gate electrode of the first switching element Tr1 included in the n+3-th stage STn+3. Accordingly, the n+3-th stage STn+3 is set in the first period T1. The set operation of the n+3-th stage STn+3 in the first period T1 is identical to the above described set operation of the n-th stage STn in the initial period T0.

The n-th carry pulse CPn output from the n-th stage STn is also supplied to the gate electrode of the second switching element Tr2 included in the n−4-th stage STn−4. Accordingly, the n−4-th stage STn−4 is reset in the first period T1. The reset operation of the n−4-th stage STn−4 in the first period T1 is identical to a reset operation of the n-th stage STn, which will be described later. Accordingly, the reset operation refers to the following description.

The fifth clock pulse CLK5 transitions from a high level to a low level at an end time of the first period T1. From this time, the high-level carry pulse CPn and high-level scan pulse SPn transition to a low level. As a result, as illustrated in FIG. 4, the carry pulse CPn and scan pulse SPn fall to the level of the first discharge voltage VSS1 at the end time of the first period T1.

Second Period T2

Next, operation in a second period T2 will be described.

The second period T2 corresponds to a rest period of the n-th stage STn. In the second period T2, a high-level n+4-th scan pulse SPn+4 generated from the n+4-th stage STn+4 is input to the n-th stage STn, thereby resetting the n-th stage STn. This reset operation will be described in more detail.

That is, the n+4-th carry pulse CPn+4 is supplied to the gate electrode of the second switching element Tr2 included in the n-th stage STn. Then, the second switching element Tr2 of the n-th stage STn is turned on. Through the turned-on second switching element Tr2, the first discharge voltage VSS1 is supplied to the set node Q of the n-th stage STn. As a result, the set node Q is discharged and, as such, the carry pull-up switching element Uc, scan pull-up switching element Uc, fourth switching element Tr4, sixth switching element Tr6, ninth switching element Tr9, and eleventh switching element Tr11, which are connected, at the gate electrodes thereof, to the discharged set node Q, are turned off.

In this case, as the fourth switching element Tr4 is turned off, the first common node CN1 may be charged with a high-level first AC voltage Vac1. As a result, the fifth switching element Tr5, which is connected, at the gate electrode thereof, to the charged first common node CN1, is turned on. Then, the first AC voltage Vac1 is applied to the first reset node QB1 via the turned-on fifth switching element Tr5 and, as such, the first reset node QB1 is charged. Accordingly, the first carry pull-down switching element Dc1, first scan pull-down switching element Ds1, and thirteenth switching element Tr13, which are connected, at the gate electrodes thereof, to the charged first reset node QB1, are turned on.

In this case, the first discharge voltage VSS1 is supplied to the set node Q via the turned-on thirteenth switching element Tr13 and, as such, the stability of the discharge state of the set node Q is increased.

In the second period T2, the second reset node QB2 is still maintained in a discharge state. Accordingly, the second carry pull-down switching element Dc2, second scan pull-down switching element Ds2, and fourteenth switching element Tr14, which are connected, at the gate electrodes thereof, to the second reset node QB2, are maintained in an OFF state.

As the first carry pull-down switching element Dc1 and first scan pull-down switching element Ds1 of the n-th stage STn are turned on in the second period T2, the first discharge voltage VSS1 and second discharge voltage VSS2 are output through the turned-on elements, respectively. That is, the turned-on carry pull-down switching element Dc1 outputs the first discharge voltage VSS1 through the carry output terminal COT, and the turned-on first scan pull-down switching element Ds1 outputs the second discharge voltage VSS2 through the scan output terminal SOT.

The first discharge voltage VSS1 output from the first carry pull-down switching element Dc1 is supplied to the n+3-th stage STn+3 and n−4-th stage STn−4. On the other hand, the second discharge voltage VSS2 output from the first scan pull-down switching element Ds1 is supplied to the n-th gate line.

Accordingly, as illustrated in FIG. 5, in the second period T2, the voltage of the n-th scan pulse SPn applied to the n-th gate line while having a low level rises from the level of the first discharge voltage VSS1 to the level of the second discharge voltage VSS2. The voltage of the n-th gate line rises from the level of the first discharge voltage VSS1 to the level of the second discharge voltage VSS2 at a rising edge time of the n+4-th carry pulse CPn+4.

As a result, in the second period T2, the n-th stage STn discharges the set node Q thereof, and charges the first reset node QB1 thereof while maintaining the second reset node QB2 thereof in a discharge state. The n-th stage STn is reset in the second period T2. In addition, in the second period T2, the voltage of the n-th scan pulse SPn, which has a low level, rises from the level of the first discharge voltage VSS1 to the level of the second discharge voltage VSS2.

The remaining stages operate in the above described manner.

As illustrated in FIG. 5, there is an overlap period between the initial period T0 and the first period T1 (that is, an overlap period between the n–3-th carry pulse CPn–3 and the fifth clock pulse CLK5). In the overlap period, the n-th stage STn simultaneously executes the above described operation in the initial period T0 and the above described operation in the first period T1.

When the first AC voltage Vac1 is subsequently changed into negative polarity, and the second AC voltage Vac1 is subsequently changed into positive polarity in a second frame period, the first reset node QB1 of the n-th stage STn is discharged, and the second reset node QB2 of the n-th stage STn is charged in an initial period included in the second frame period.

In the second frame period, the second carry pull-down switching element Dc2, second scan pull-down switching element Ds2, and fourteenth switching element Tr14 of the n-th stage STn are turned on, whereas the first carry pull-down switching element Dc1, first scan pull-down switching element Ds1, and thirteenth switching element Tr13 of the n-th stage STn are turned off.

The remaining stages operate in the same manner as described above.

As described above, the low-level voltage of the scan pulse supplied to each gate line is varied to have two different values. The low-level voltage of the scan pulse is varied from the level of the first discharge voltage VSS1 to the level of the second discharge voltage VSS2 or from the level of the second discharge voltage VSS2 to the level of the first discharge voltage VSS1 at a particular time. Accordingly, it may be possible to considerably reduce a falling edge period of the scan pulse. This is because the scan pulse may reach a target level (VSS2 level) within a relatively short time in accordance with sharp falling thereof to the level of the first discharge voltage VSS1 lower than the target level.

It may be possible to drive each gate line by a normal voltage by raising the scan pulse to the target level higher than the level of the first discharge voltage VSS1 after dropping the scan pulse to the level of the first discharge voltage VSS1.

Figure 6:
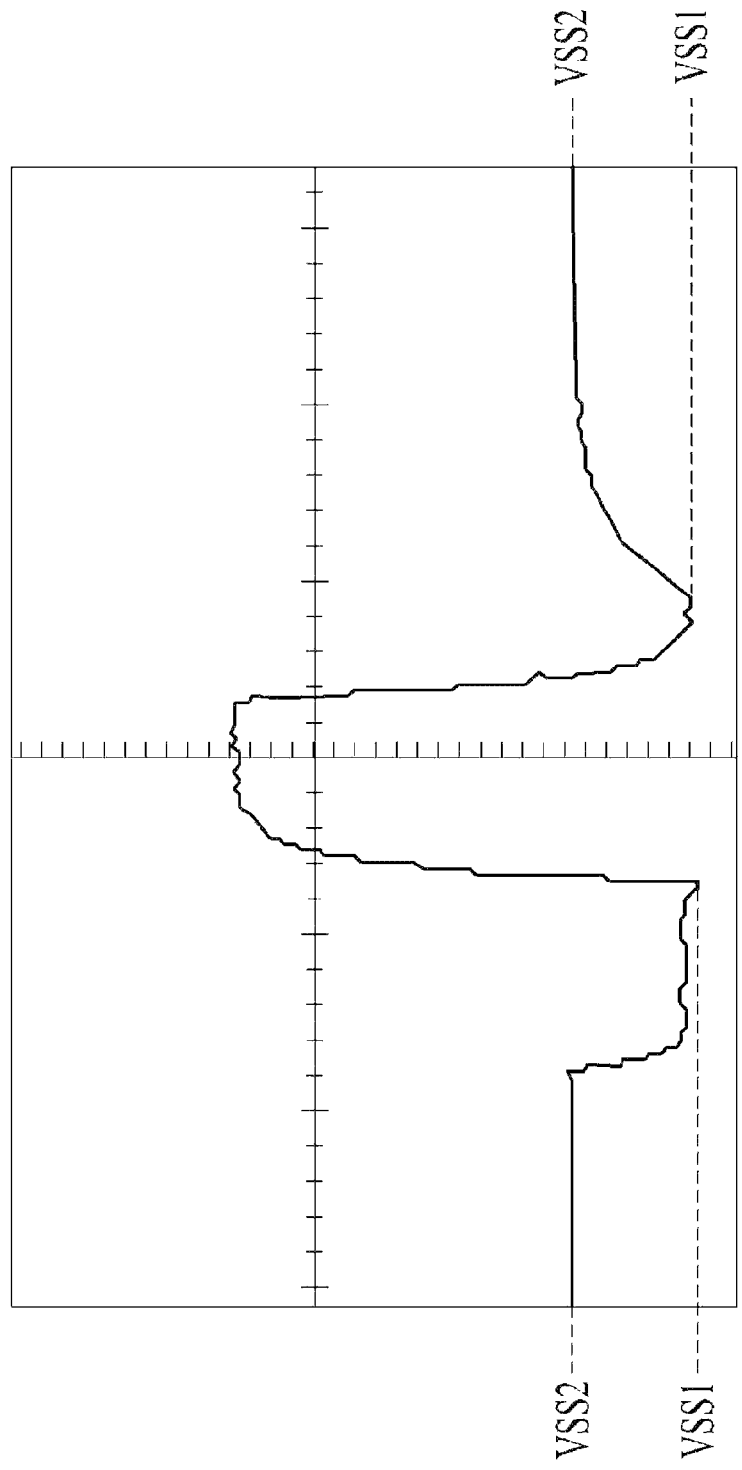
FIG. 6 is a diagram illustrating a waveform of a scan pulse output from one of the stages included in the shift register according an embodiment.

FIG. 6 is a diagram explaining effects of the shift register. That is, FIG. 6 illustrates a waveform of a scan pulse output from one of the stages included in the shift register according to one embodiment.

Referring to FIG. 6, when the scan pulse transitions to a low level state, the voltage of the scan pulse returns to the level of the second discharge voltage VSS2 after falling to the level of the first discharge voltage VSS1.

In addition, in order to increase the drivability of the shift register while reducing leakage current, two discharge voltages VSS1 and VSS2 are supplied to each stage, and the output unit of each stage is divided into a carry output unit CO connected to a relatively small load and a scan output unit SO connected to a relatively large load and, as such, a small pull-up switching element and the first discharge voltage VSS1 are provided at the carry output unit CO, and a large pull-up switching element and the second discharge voltage VSS2 are provided at the scan output unit SO. In accordance with this configuration, it may be possible to reduce the leakage current.

The above described effects of the shift register and a principle associated therewith will be described in more detail.

In each stage, switching elements associated with the output of the stage include the scan pull-up switching element Us included in the scan output unit SO and the carry pull-up switching element Uc included in the carry output unit CO.

The scan pull-up switching element Us included in the scan output unit SO is connected to a greater load than that of the carry pull-up switching element Uc included in the carry output unit CO. This is because the carry pull-up switching element Uc is connected to an upstream stage and a downstream stage, whereas the scan pull-up switching element Us is connected to a gate line and a number of switching elements connected to the gate line.

The scan pull-up switching element Us is adapted to drive the associated gate line and generates a higher output than that of the carry pull-up switching element Uc, which is adapted to control the upstream and downstream stages. To this end, in order to form pull-up switching elements on a limited area at a increased degree of integration, a the scan pull-up switching element Us, which is connected to a greater load and is required to generate a higher output, with a larger size than the carry pull-up switching element Uc may be used.

The carry pull-up switching element Uc is connected to a smaller load than that of the scan pull-up switching element Us and, as such, the difficulty in controlling operations of the upstream and downstream stages is reduced, even when the output from the carry pull-up switching element Uc is relatively low.

In accordance with the above described structure, the carry pull-up switching element Uc has a higher internal resistance than the scan pull-up switching element Us and, as such, it may be possible to reduce generation of leakage current from the carry pull-up switching element Uc in an OFF state of the carry pull-up switching element Uc.

The scan pull-up switching element Us may have a structure weak to leakage current in an OFF state thereof due to the large size thereof. However, generation of such leakage current may be reduced because different discharge voltages are supplied to the gate and source electrodes of the scan pull-up switching element Us, respectively, when the scan pull-up switching element Us is turned off. That is, when the scan pull-up switching element Us is turned off, the first discharge voltage VSS1 is supplied to the gate electrode of the scan pull-up switching element Us, whereas the second discharge voltage VSS2 higher than the first discharge voltage VSS1 is supplied to the source electrode of the scan pull-up switching element Us and, as such, the gate-source voltage of the scan pull-up switching element Us is maintained at a negative level lower than 0. In one embodiment, when the scan pull-up switching element Us is an NMOS transistor, the scan pull-up switching element Us may be maintained in a completely turned-off state.

In another embodiment, when a PMOS transistor is used as the scan pull-up switching element Us, the first discharge voltage VSS1 and second discharge voltage VSS2 may be set such that the first discharge voltage VSS1 has a higher voltage value than the second discharge voltage VSS2. In this case, there are effects of reducing generation of leakage current from the scan pull-up switching element Us even though the scan pull-up switching element Us is formed to have a large size for generation of a high output.

In addition, since the first discharge voltage VSS1 is lower than the second discharge voltage VSS2, it may be possible to reduce stress applied to the pull-down switching elements Dc1, Dc2, Ds1, and Ds2.

When the low-level voltage value of the clock pulse supplied to the drain electrode of the scan pull-up switching element Us is set to be lower than the second discharge voltage VSS2 or to be equal to the first discharge voltage VSS1, the voltage of the scan pulse may rapidly fall from a high level to a low level and, as such, it may be possible to reduce the falling edge time of the scan pulse supplied to the associated gate line. In this case, an increased margin between scan pulses may be achieved. Thus, in accordance with embodiments of the shift register, pull-up switching elements and pull-down switching elements without large sizes for reduction of the falling edge time of scan pulses may be used and, as such, it may be possible to considerably reduce size of the shift register. In addition, it may be possible to reduce bezel size of the display apparatus.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A shift register comprising:
a plurality of stages for sequentially outputting output pulses comprising carry pulses and scan pulses, each of the stages of the plurality of stages comprising:
   a carry output unit for generating a carry pulse, the carry output unit coupled to a first discharge voltage and a clock pulse having a low-level voltage with a level substantially equal to the first discharge voltage, and supplying the generated carry pulse to at least one of an upstream stage of the plurality of stages and a downstream stage of the plurality stages,
   a scan output unit for generating a scan pulse, the scan output unit coupled to a second discharge voltage having a higher voltage value than the first discharge voltage and the clock pulse, and supplying the generated scan pulse to a corresponding gate line of a plurality of gate lines, and
   a node controller for controlling voltages at nodes connected to the carry output unit and the scan output unit.

2. The shift register according to claim 1, wherein the node controller of an n-th stage of the plurality of stages, n being a natural number, comprises:
   a first switching element controlled in accordance with a start pulse received from an external source or the carry pulse from an (n–x)-th stage of the plurality of stages, x being a natural number, and connected between a charge voltage line transmitting a charge voltage and a set node of the n-th stage;
   a second switching element controlled in accordance with the carry pulse from an (x+y)-th stage of the plurality of stages, y being a natural number, and connected between the set node and a first discharge voltage line transmitting the first discharge voltage;
   a third switching element controlled in accordance with a first AC voltage from a first AC voltage line, and connected between the first AC voltage line and a first common node;
   a fourth switching element controlled in accordance with a voltage applied to the set node, and connected between the first common node and the first discharge voltage line;
   a fifth switching element controlled in accordance with a voltage applied to the first common node, and connected between the first AC voltage line and a first reset node of the n-th stage;
   a sixth switching element controlled in accordance with the voltage applied to the set node, and connected between the first reset node and the first discharge voltage line;
   a seventh switching element controlled in accordance with the carry pulse from the (n–x)-th stage, and connected between the first reset node and the first discharge voltage line;
   an eighth switching element controlled in accordance with a second AC voltage from a second AC voltage line, and connected between the second AC voltage line and a second common node;
   a ninth switching element controlled in accordance with the voltage applied to the set node, and connected between the second common node and the first discharge voltage line;
   a tenth switching element controlled in accordance with a voltage applied to the second common node, and connected between the second AC voltage line and the second reset node;
   an eleventh switching element controlled in accordance with the voltage applied to the set node, and connected between the second reset node and the first discharge voltage line;
   a twelfth switching element controlled in accordance with the carry pulse from the (n–x)-th stage, and connected between the second reset node and the first discharge voltage line;
   a thirteenth switching element controlled in accordance with a voltage applied to the first reset node, and connected between the set node and the first discharge voltage line; and
   a fourteenth switching element controlled in accordance with a voltage applied to the second reset node, and is connected between the set node and the first discharge voltage line.

3. The shift register according to claim 2, wherein the node controller in each of the stages other than the stages receiving the start pulse via the first switching element further comprises:
   a fifteenth switching element controlled in accordance with the start pulse, and connected between the set node and the first discharge voltage line.

4. The shift register according to claim 3, wherein:
the start pulse is supplied to the first switching element of each of first to x-th stages of the plurality of stages; and
the node controller in each of the stages other than the first to x-th stages further comprises the fifteenth switching element.

5. The shift register according to claim 2, wherein x is 3, and y is 4 or 5.

6. The shift register according to claim 1, wherein:
the carry output unit of an n-th stage of the plurality of stages, n being a natural number, comprises
a carry pull-up switching element controlled in accordance with a voltage applied to a set node of the n-th stage, and connected between a clock transmission line to transmit the clock pulse and a carry output terminal of the n-th stage;

a first carry pull-down switching element controlled in accordance with a voltage applied to a first reset node of the n-th stage, and connected between the carry output terminal of the n-th stage and a first discharge voltage line to transmit the first discharge voltage; and a second carry pull-down switching element controlled in accordance with a voltage applied to a second reset node of the n-th stage, and connected between the carry output terminal of the n-th stage and the first discharge voltage line; and the carry output terminal of the n-th stage is connected to an (n+x)-th stage of the plurality of stages, x being a natural number, and an (n−y)-th stage of the plurality of stages, y being a natural number.

7. The shift register according to claim 1, wherein:

the scan output unit of an n-th stage of the plurality of stages, n being a natural number, comprises:

a scan pull-up switching element controlled in accordance with a voltage applied to a set node of the n-th stage, and connected between a clock transmission line to transmit the clock pulse and a scan output terminal of the n-th stage;

a first scan pull-down switching element controlled in accordance with a voltage applied to a first reset node of the n-th stage, and connected between the scan output terminal of the n-th stage and a second discharge voltage line to transmit the second discharge voltage; and a second scan pull-down switching element controlled in accordance with a voltage applied to a second reset node of the n-th stage, and connected between the scan output terminal of the n-th stage and the second discharge voltage line; and the scan output terminal of the n-th stage is connected to an n-th gate line of the plurality of gate lines.

8. The shift register according to claim 7, wherein x is 3, and y is 4 or 5.

9. The shift register according to claim 1, wherein the clock pulse is one of first to sixth clock pulses having different phases.

10. The shift register according to claim 9, wherein:

each of the first to sixth clock pulses has a pulse width corresponding to three horizontal periods; and the pulse widths of sequential clock pulses of the first to sixth clock pulses overlap with each other for a predetermined overlap period.

11. The shift register according to claim 10, wherein the predetermined overlap period corresponds to two horizontal periods.

12. The shift register according to claim 1, wherein the scan pulse generated by the scan output unit transitions from the second discharge voltage to the first discharge voltage in response to a rising edge of a carry pulse from a previous stage, and the scan pulse transitions from the first discharge voltage to the second discharge voltage in response to a rising edge of a carry pulse from a subsequent stage.

13. The shift register according to claim 12, wherein the scan pulse transitions from the first discharge voltage to a voltage level of the clock pulse in response to a rising edge of the clock pulse, and the scan pulse transitions from the voltage level of the clock pulse to the first discharge voltage in response to a falling edge of the clock pulse.

* * * * *